United States Patent
Kang et al.

(10) Patent No.: US 6,818,976 B2
(45) Date of Patent: Nov. 16, 2004

(54) BUMPED CHIP CARRIER PACKAGE USING LEAD FRAME

(75) Inventors: In Ku Kang, Cheonan (KR); Sang Ho Ahn, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/118,944

(22) Filed: Apr. 10, 2002

(65) Prior Publication Data

US 2003/0015780 A1 Jan. 23, 2003

(30) Foreign Application Priority Data

Jul. 19, 2001 (KR) ......................................... 2001-43446

(51) Int. Cl.$^7$ .......................... H01L 23/28; H01L 23/48; H01L 23/495; H01L 23/02
(52) U.S. Cl. ........................ 257/684; 257/784; 257/738; 257/691; 257/692; 257/693; 257/696; 257/698; 257/786; 257/737; 257/796
(58) Field of Search ................................ 257/784, 734, 257/737, 738, 690, 692, 693, 696, 698, 676, 796, 684

(56) References Cited

U.S. PATENT DOCUMENTS

| | | | | | |
|---|---|---|---|---|---|
| 5,856,212 A | * | 1/1999 | Chun | ........................ | 438/126 |
| 5,900,676 A | * | 5/1999 | Kweon et al. | .............. | 257/787 |
| 6,031,292 A | * | 2/2000 | Murakami et al. | .......... | 257/778 |
| 6,163,069 A | * | 12/2000 | Oohira et al. | ................ | 257/684 |
| 6,191,494 B1 | * | 2/2001 | Ooyama et al. | ............ | 257/597 |
| 6,211,462 B1 | * | 4/2001 | Carter et al. | ............... | 174/52.4 |
| 6,278,177 B1 | * | 8/2001 | Ryu | ........................ | 257/678 |
| 6,294,830 B1 | * | 9/2001 | Fjelstad | ...................... | 257/724 |
| 6,306,685 B1 | * | 10/2001 | Liu et al. | .................... | 438/121 |
| 6,410,979 B2 | * | 6/2002 | Abe | .......................... | 257/684 |
| 6,414,385 B1 | * | 7/2002 | Huang et al. | ............... | 257/690 |
| 2001/0035569 A1 | * | 11/2001 | Shibata | ....................... | 257/667 |
| 2001/0048166 A1 | * | 12/2001 | Miyazaki | .................... | 257/778 |
| 2002/0096756 A1 | * | 7/2002 | Kobayakawa | ............... | 257/687 |
| 2002/0160552 A1 | * | 10/2002 | Minamio et al. | .......... | 438/108 |
| 2003/0025201 A1 | * | 2/2003 | Harada | ....................... | 257/734 |

* cited by examiner

*Primary Examiner*—Alexander Oscar Williams
(74) *Attorney, Agent, or Firm*—Lee & Sterba, P.C.

(57) ABSTRACT

An improved bumped chip carrier (BCC) package according to the present invention includes a resin-molded lead frame encapsulating an attached semiconductor integrated circuit (IC) and a plurality of interconnecting wire bonds attaching a plurality of contact pads on the IC to an associated plurality of solder-covered external contact terminals that are integrated in the lead frame. By integrally processing the external contact terminals, bonding wires may be affixed using a single wire bonding process. A method for manufacturing the BCC package preferably includes a dual photoresist patterning process accompanied by a dual wet etching process to create a plurality of highly reliable external contact terminals having improved bonding between the contact terminals and the encapsulating resin mold.

2 Claims, 7 Drawing Sheets

BUMPED CHIP CARRIER PACKAGE USING LEAD FRAME

BACKGROUND OF THE INVENTION

1. Field of the Invention

The present invention relates to a semiconductor package and a method for manufacturing the same. More particularly, the present invention relates to a bumped chip carrier package using a lead frame and a method for manufacturing the same.

2. Description of the Related Art

In an effort to reduce the size and weight of multi-function electronic devices while simultaneously increasing speed and performance, high-density integrated circuits (ICs) are being mounted in high-density packages. One such high-density package is a chip scale package (CSP), wherein ICs are mounted directly on a substrate. Although such CSPs have been manufactured in sizes as small as a single IC, a CSP may provide for the mounting of multiple ICs on a common substrate or carrier, such as a printed circuit board (PCB), a tape circuit board, or a lead frame. One such conventional CSP is a bumped chip carrier (BCC) package, which uses a lead frame as shown in FIGS. 1 through 3, wherein FIG. 2 illustrates a cross-sectional view taken along line 2—2 in FIG. 1.

Referring to the two views of the BCC package shown in FIGS. 1 and 2, a semiconductor chip 20 is attached to a chip mounting area 12 of a lead frame 10, and a plurality of contact grooves 14 are formed around the periphery of the chip mounting area 12. Each one of a plurality of bonding pads 24 on semiconductor chip 20 are electrically connected to an associated contact groove 14 by a bonding wire 30. The semiconductor chip 20, the plurality of bonding wires 30, and the plurality of contact grooves 14 on lead frame 10 are then encapsulated with a molding resin to form a resin mold 40.

Each contact groove 14 typically includes a depression having an overlaying plating layer 16, which is formed by successive deposition and/or etching of metal layers using metals, such as stannum (Sn), palladium (Pd), and aurum (Au). Since it is difficult to attach a bonding wire 30 directly to the concave plating layer 16, a conventional procedure for connecting the bonding wire 30 to the plating layer 16 is typically a two-step process.

In a first step, a first plurality of ball solder bumps 32 are formed on each one of the contact locations on plating layer 16 using a ball bonding technique. A second plurality of ball solder bumps are then formed on each one of the bonding pads 24 of semiconductor chip 20. A stitch bonding operation is then performed to connect each end of the bonding wires 30 to the associated ball solder bumps.

An alternate variation on this conventional CSP might feature the elimination of lead frame 10 under the resin mold 40 by using a selective etching, such as that shown by the conventional bumped chip carrier package 50 of FIG. 3. In bumped chip carrier package 50, an external contact terminal 18 has a structure in which plating layer 16 is filled with a molding resin.

Because the height of the external contact terminals 18 in the bumped chip carrier package 50 may be adjustably controlled during the manufacturing process of the lead frame, the bumped chip carrier package 50 has a significant advantage over conventional semiconductor chip mounting techniques using conventional solder balls as an external contact terminal.

Disadvantageously, however, since a conventional external contact terminal structure features a plating layer 16 being filled with a molding resin, plating layer 16 may exhibit cracking due to a difference in thermal expansion coefficients between the plating layer 16 and the molding resin during conventional manufacturing tests of bumped chip carrier package 50, for example, during a temperature cycling (T/C) test. Another significant disadvantage of conventional CSPs is that the aforementioned two-step ball bonding operation is typically required in the wire bonding process.

SUMMARY OF THE INVENTION

In an embodiment of the present invention, a bumped chip carrier (BCC) package is manufactured to use a lead frame capable of preventing damage to an external contact terminal during manufacturing testing.

A feature of an embodiment of the present invention provides a BCC package using a lead frame capable of electrically connecting a semiconductor chip and an internal contact terminal using a single wire bonding process.

According to an aspect of an embodiment of the present invention, a method for manufacturing a bumped chip carrier package is provided which includes, (a) providing a lead frame having a chip mounting area and a plurality of internal contact terminals protruding from the lead frame beyond the chip mounting area, (b) attaching a semiconductor chip having a plurality of bonding pads to the chip mounting area, (c) electrically connecting each one of the plurality of bonding pads of the semiconductor chip to an associated one of a plurality of internal contact terminals using one of a plurality of bonding wires, (d) forming a resin mold by encapsulating the semiconductor chip, the plurality of bonding wires, and the plurality of internal contact terminals on the lead frame with a molding resin, and (e) forming a plurality of external contact terminals by removing the lead frame except for a portion under each one of the plurality of internal contact terminals.

In the above method, (a) may additionally include (a1) providing a lead frame, (a2) forming a first photoresist pattern at a plurality of locations associated with the locations for formation of the plurality of internal contact terminals on the lead frame, (a3) forming the plurality of internal contact terminals by wet etching the lead frame assembly outside of the first photoresist pattern to a predetermined depth, and (a4) removing the first photoresist pattern.

Further, (e) may additionally include (e1) forming a second photoresist pattern under the lead frame such that a plurality of openings are created, each of the plurality of openings being located under one of the plurality of internal contact terminals, (e2) forming a plurality of solder plating layers, each one being formed in an associated one of the plurality of openings in the second photoresist pattern, (e3) removing the second photoresist pattern, (e4) removing the lead frame located outside of the plurality of solder plating layers by using the plurality of solder plating layers as masks, and (e5) forming the plurality of external contact terminals by re-flowing the plurality of solder plating layers, such that the lead frame under each one of the plurality of solder plating layers are covered with solder.

Preferably, each one of the plurality of openings in the second photoresist pattern is formed to a size sufficient to include at least one of the plurality of internal contact terminals.

According to another aspect of an embodiment of the present invention, a bumped chip carrier package includes a semiconductor chip on which at least one bonding pad is formed, at least one lead frame terminal arranged close to the semiconductor chip, wherein a lower portion of the lead frame terminal is located beneath a bottom side of the semiconductor chip, at least one bonding wire electrically connecting the bonding pad to the lead frame terminal, and a resin mold formed by encapsulating the semiconductor chip, the bonding wire, and an upper portion of the lead frame terminal with a molding resin, wherein the resin mold is formed so the bottom side of the semiconductor chip is externally exposed.

Additionally, the lead frame terminal includes at least one internal contact terminal located internally to the resin mold, at least one bonding wire connected between the internal contact terminal and the bonding pad of the semiconductor chip, and at least one solder-plated external contact terminal formed under the internal contact terminal and extending beyond the resin mold so that the external contact terminal is located below the bottom side of the semiconductor chip.

Preferably, a middle portion of the internal contact terminal is formed having a constricted shape.

These and other features and aspects of the present invention will be readily apparent to those of ordinary skill in the art upon review of the detailed description that follows.

BRIEF DESCRIPTION OF THE DRAWINGS

FIGS. 4-15 illustrate a manufacturing process of a bumped chip carrier package using a lead frame according to an embodiment of the present invention, wherein:

FIG. 4 illustrates a top view of a first photoresist pattern that is formed on a lead frame;

FIG. 5 illustrates a cross-sectional view taken along line 5—5 in FIG. 4;

FIG. 6 illustrates a cross-sectional view of the lead frame after a first wet etching step;

FIG. 7 illustrates a cross-sectional view of a lead frame in which a plurality of internal contact terminals are formed by removing the first photoresist pattern of FIG. 4;

FIG. 8 illustrates a cross-sectional view of an attachment of a semiconductor chip to the lead frame;

FIG. 9 illustrates a cross-sectional view of an attachment of a plurality of bonding wires;

FIG. 10 illustrates a cross-sectional view of an encapsulation of the assembly using a resin mold;

FIG. 11 illustrates a cross-sectional view of a formation of a second photoresist pattern;

FIG. 12 illustrates a cross-sectional view of a formation of a solder plating layer;

FIG. 13 illustrates a cross-sectional view of a removal of the second photoresist pattern;

FIG. 14 illustrates a cross-sectional view of the lead frame after a second wet etching step; and FIG. 15 illustrates a cross-sectional view of a formation of a plurality of external contact terminals using a solder re-flowing of a solder plating layer.

DETAILED DESCRIPTION OF THE INVENTION

Korean Patent Application No. 2001-43446 filed on Jul. 19, 2001, and entitled "Bumped Chip Carrier Package Using Lead Frame and Method for Manufacturing The Same," is incorporated by reference herein in its entirety.

The present invention will now be described more fully hereinafter with reference to the accompanying drawings, in which preferred embodiments of the invention are shown. This invention may, however, be modified in different forms and should not be construed as limited to the embodiments set forth herein. Rather, these embodiments are provided so that this disclosure will be thorough and complete, and will fully convey the scope of the invention to those of ordinary skill in the art. Like reference numbers refer to like elements throughout.

FIGS. 4 to 15 illustrate a cross-sectional view of the steps of a process for manufacturing a bumped chip carrier package having a lead frame 61 according to an embodiment of the present invention. Although only one lead frame 61 is shown in FIGS. 4 to 15, multiple lead frames may be manufactured simultaneously using a strip form of manufacturing in the application of the following steps.

Figure 1:
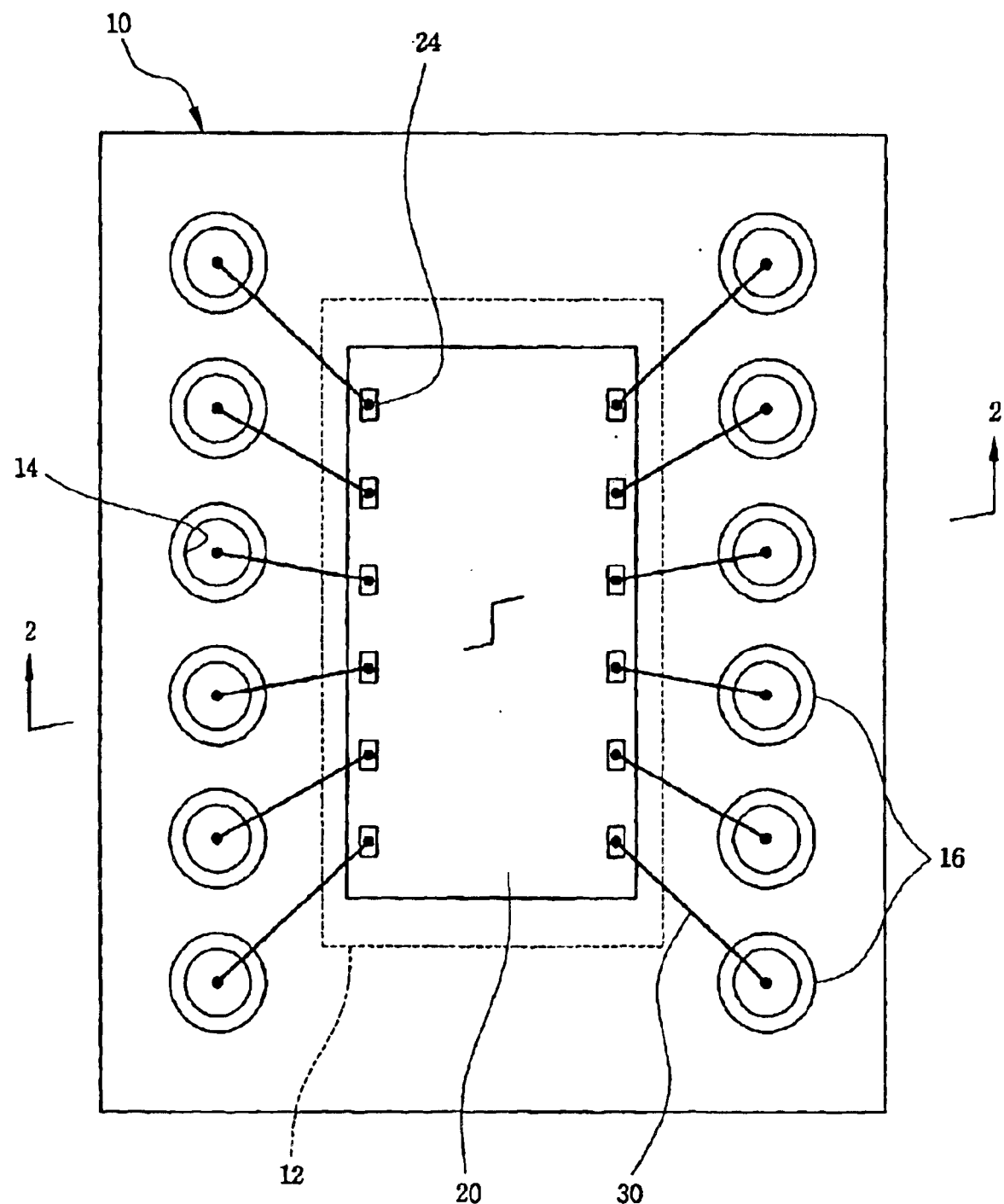
FIG. 1 illustrates a top view of a conventional lead frame having a bumped chip carrier package with an attached semiconductor chip.
Figure 2:
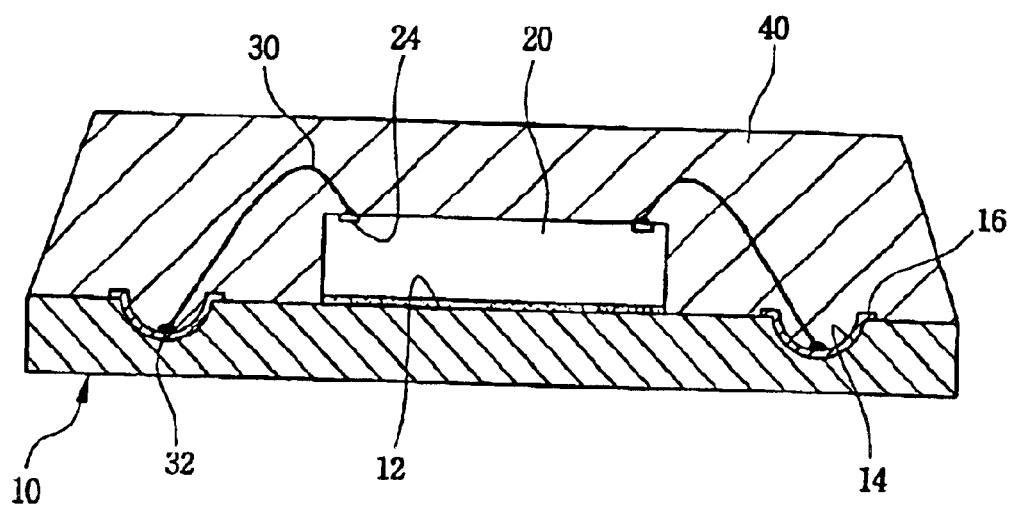
FIG. 2 illustrates a cross-sectional view taken along line 2—2 in FIG. 1, showing a bumped chip carrier package having a resin mold.
Figure 3:
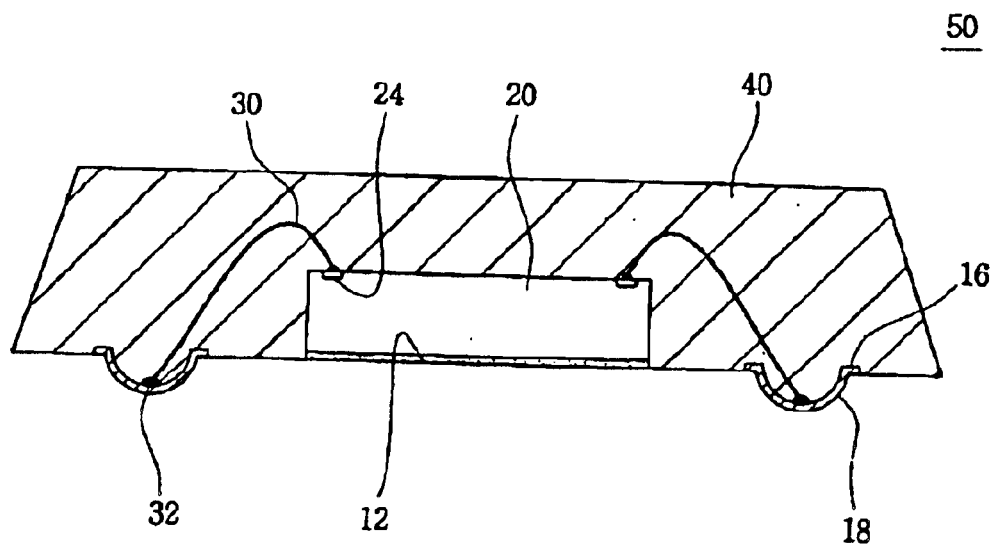
FIG. 3 illustrates a cross-sectional view of a conventional bumped chip carrier package that is manufactured without a lead frame.
Figure 4:
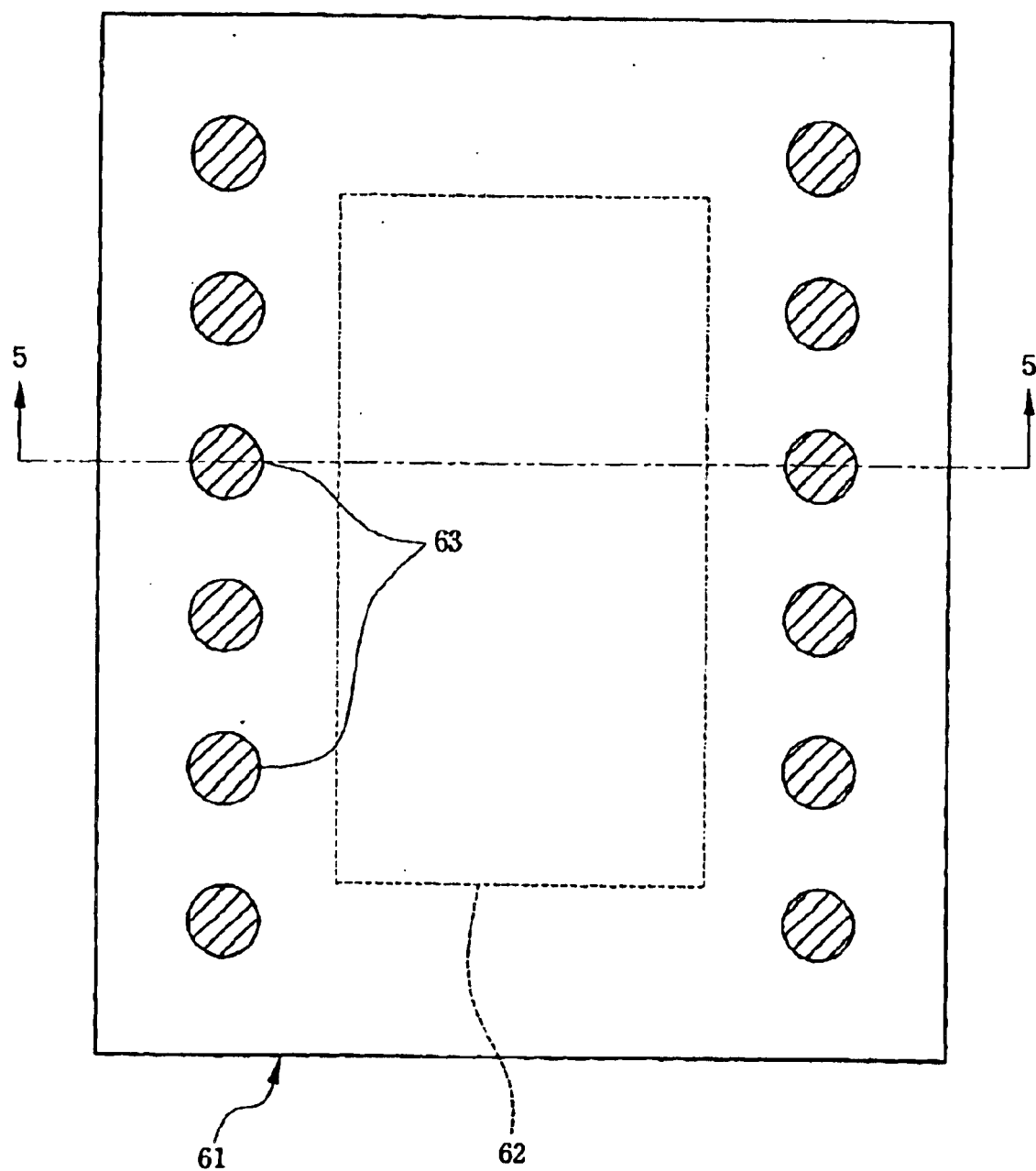
Figure 5:
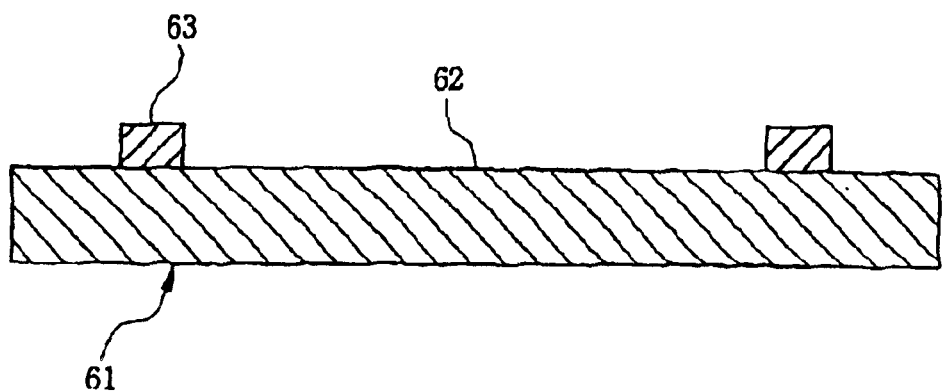

FIGS. 4 and 5 illustrate a top view and a cross-sectional view taken along the line 5—5 in FIG. 4, respectively, of the lead frame 61, which is preferably made using an alloy of iron (Fe) or copper (Cu) and has a chip mounting area 62. Referring to FIGS. 4 and 5, in a first step, a first photoresist pattern 63 is formed on an upper side of lead frame 61. More specifically, a first photoresist material is deposited on the upper side of lead frame 61, and then a desired pattern is exposed/etched to form a plurality of contact terminals.

Figure 6:
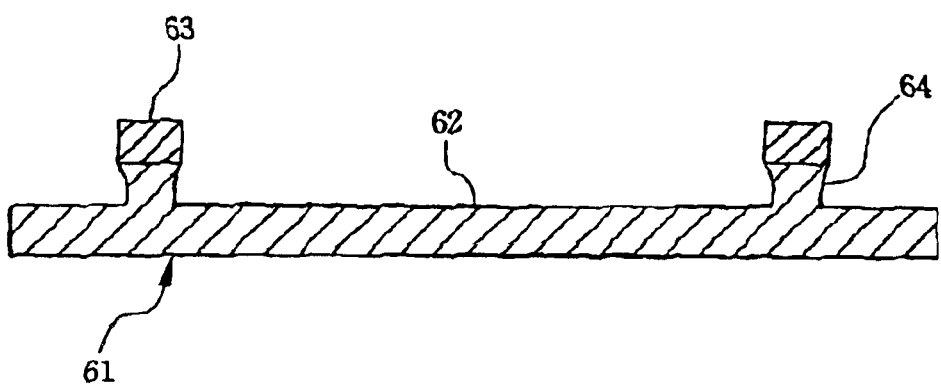

FIG. 6 illustrates a next stage, wherein a plurality of internal contact terminals 64 are formed by wet etching lead frame 61 outside of the photoresist pattern 63 to a predetermined depth. Herein, the photoresist pattern 63 is used as a mask. Since the internal contact terminals 64 are formed using a wet etching process, a middle portion of each internal contact terminal has a constricted shape.

Figure 7:
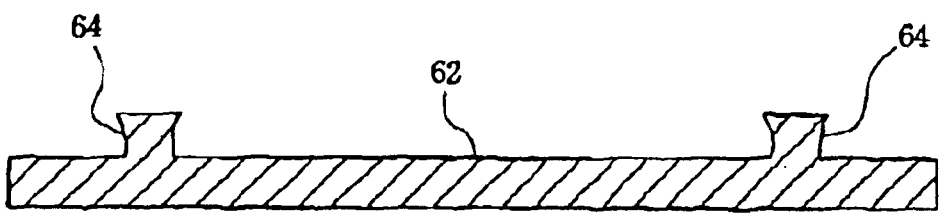

FIG. 7 illustrates a next stage, wherein the first photoresist pattern 63 is removed to expose internal contact terminals 64. For improved wire bonding characteristics, an upper portion of each internal contact terminal 64 may be laminated with silver (Ag).

Figure 8:
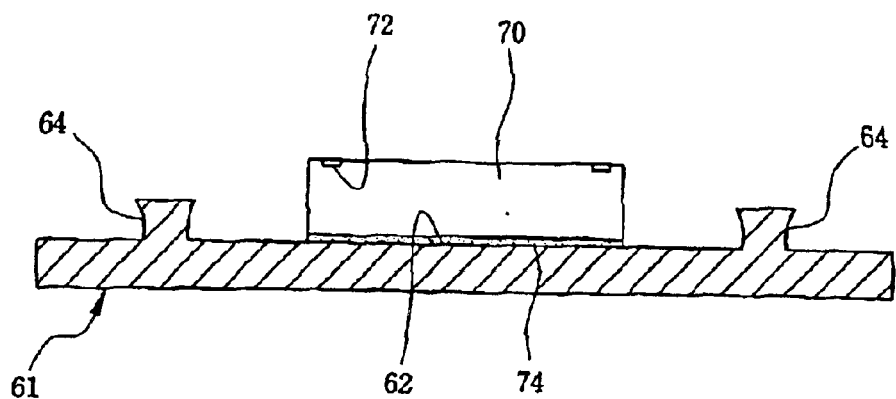

In FIG. 8, a semiconductor chip 70 having bonding pads 72 is attached to chip mounting area 62 of the lead frame 60 preferably by using an adhesive layer 74, such as silver-epoxy adhesive, solder, and double-faced adhesive tape.

Figure 9:
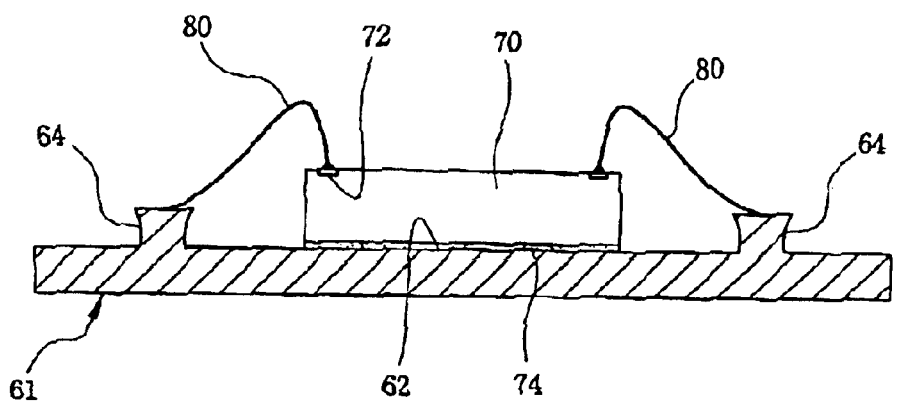

As shown in FIG. 9, a plurality of ball solder bumps are formed on each of the bonding pads 72 of semiconductor chip 70. Then, a stitch bonding operation is performed to connect each end of the bonding wires 80 to the associated internal contact terminal 64 of the lead frame 61.

Figure 10:
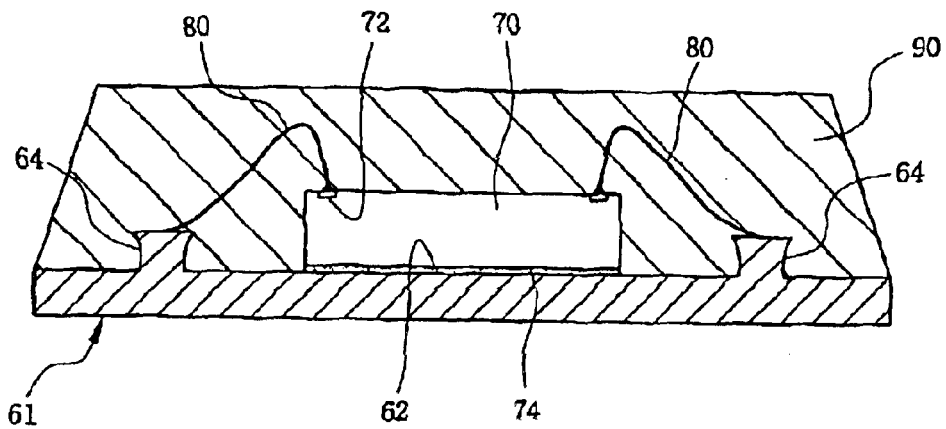

FIG. 10 illustrates an encapsulation stage, wherein a resin mold 90 is preferably formed over the entire assembly. Preferably, resin mold 90 completely encapsulates semiconductor chip 70, the plurality of bonding wires 80, and the plurality of internal contact terminals 64 on lead frame 61. A transfer molding method and/or potting method may be used to form resin mold 90. Since the middle portion of the internal contact terminal 64 has a constricted shape, resin mold 90 and lead frame 61 are more tightly bound together than if the internal contact terminal had a straight, columnar shape.

Hereinafter, an external contact terminal of the lead frame will be described with reference to FIGS. 11 through 15.

Figure 11:
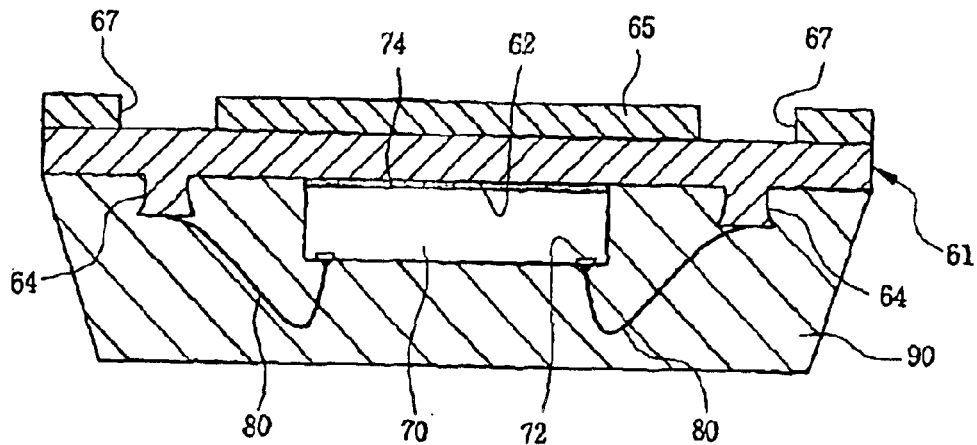

As shown in FIG. 11, a second photoresist pattern 65 is formed on an inverted lead frame 61 to a representative thickness of 10 μm such that a portion of the internal contact terminal 64 is exposed. Preferably, openings 67 in the second photoresist pattern 65 are formed to a size that is larger than the associated internal contact terminal 64.

Figure 12:
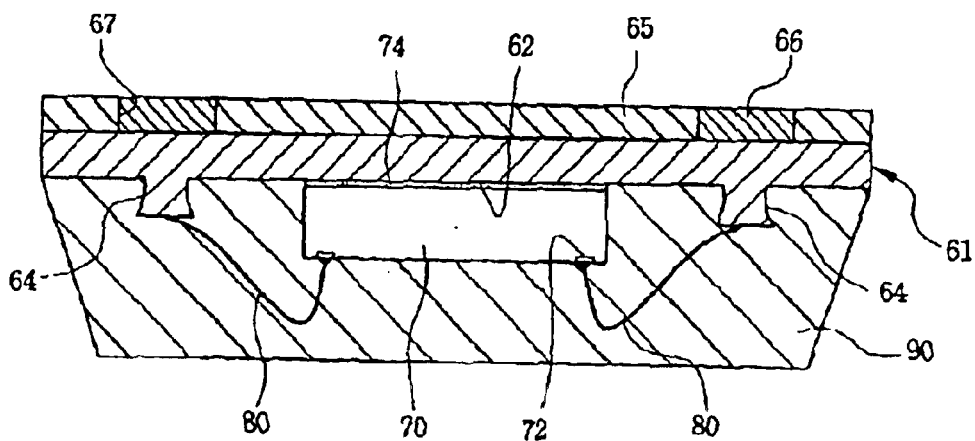

FIG. 12 illustrates a subsequent stage of forming a conductive solder plating layer 66 in each one of the openings 67. During the formation of solder plating layer 66, lead frame 61 may be used as a terminal for plating.

Figure 13:
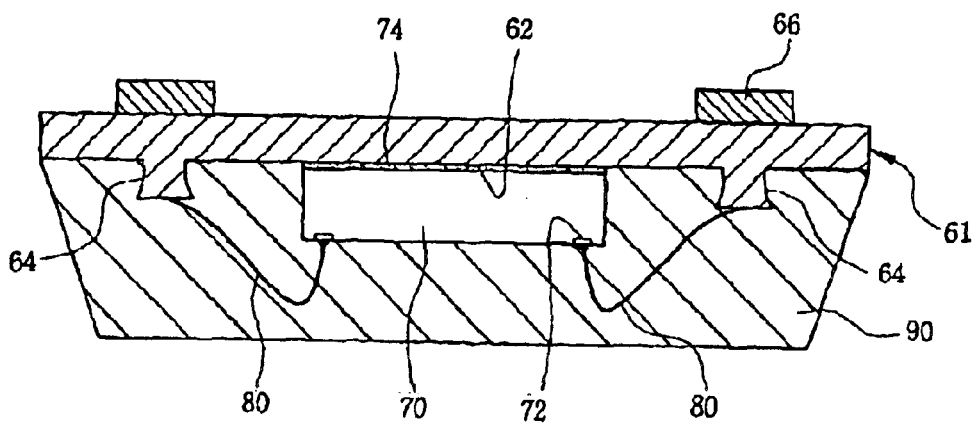

Next, as shown in FIG. 13, the second photoresist pattern 65 outside of solder plating layers 66 is removed. The remaining solder plating layers 66 are to be used as a mask during a subsequent etching process.

Figure 14:
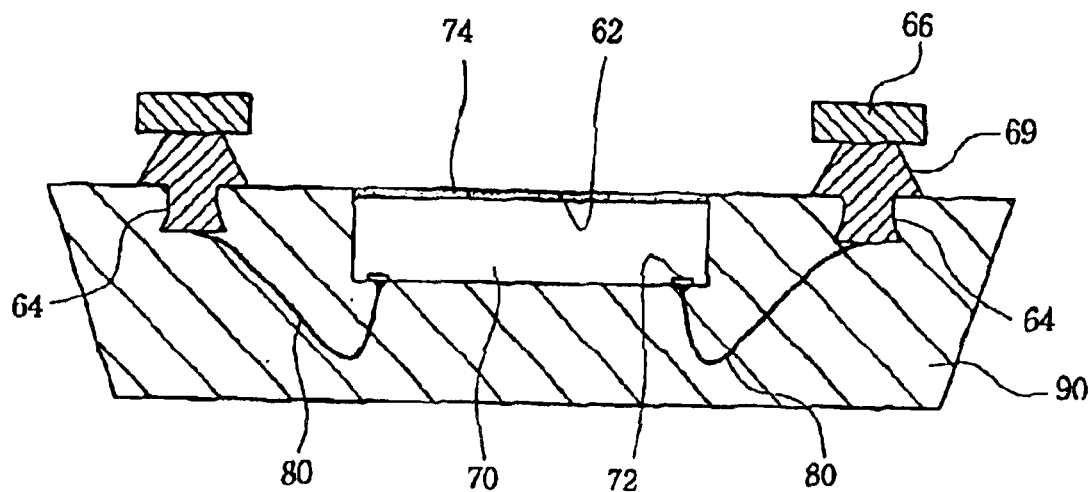

As shown in FIG. 14, the assembly is wet etched selectively using the areas of solder plating layer 66 as a mask to produce a trapezoidal-shaped protruding portion 69 under solder plating layer 66. The wet etch is performed to a sufficient depth to expose adhesive 74 and the original "bottom" side of the semiconductor chip 70, in order to provide an added benefit of a thermal path for externally dissipating any heat generated during the operation of the semiconductor chip 70.

Figure 15:
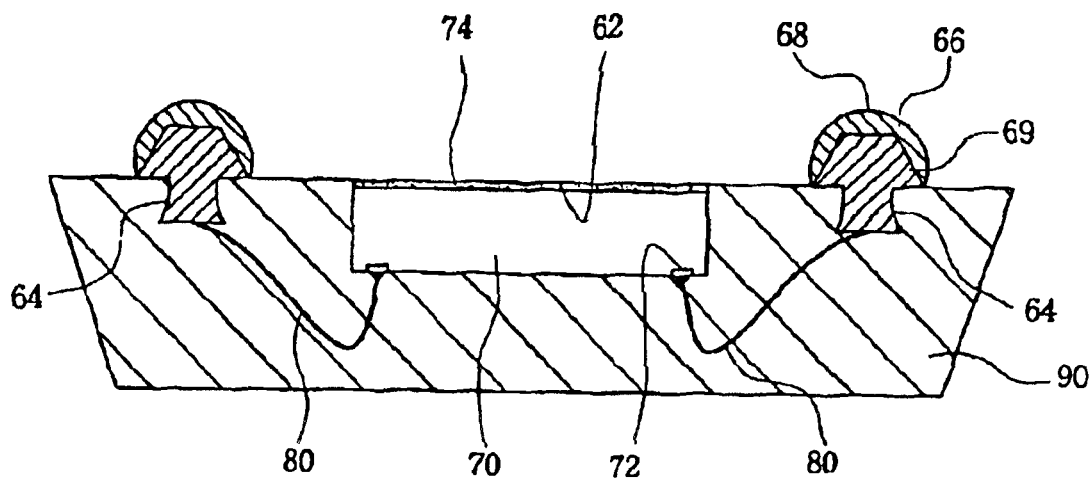

In a final stage, as shown in FIG. 15, a plurality of external contact terminals 68 are formed by re-flowing solder plating layer 66 such that a hemispherical shaped solder cap is created that covers the trapezoidal-shaped protruding portions 69. The resulting solder covering the exterior of the external contact terminals 68 provides added reliability for connection with an external mounting board.

According to an embodiment of the present invention, any damage to an external contact terminal may be prevented during manufacturing testing, such as temperature cycling (T/C), because a portion of the lead frame is used to form a frame for external contact terminals and portions of the lead frame that are exposed outside of the resin mold are covered with solder. Additionally, the present invention makes it possible to connect a semiconductor chip and an internal contact terminal by a single wire bonding process, rather than the two-step wire bonding process required in conventional manufacturing applications.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A bumped chip carrier package, comprising:

a semiconductor chip on which at least one bonding pad is formed;

at least one lead frame terminal arranged close to the semiconductor chip, wherein a lower portion of the lead frame terminal is located lower than a bottom side of the semiconductor chip;

at least one bonding wire electrically connecting the bonding pad with the lead frame terminal; and a resin mold formed by encapsulating the semiconductor chip, the bonding wire, and an upper portion of the lead frame terminal with a molding resin, wherein the resin mold is formed such that the bottom side of the semiconductor chip is not covered by the resin mold, and the lower portion of the lead frame terminal has a trapezoidal shape and protrudes from the resin mold to be external to the resin mold, wherein the lead frame terminal further includes, at least one internal contact terminal located internally to the resin mold above the trapezoidal-shaped protruding portion of the lead frame terminal and connected to the bonding pad by the bonding wire; and a reflowed solder plating layer covering an entire exterior of the trapezoidal-shaped protruding portion of the lead frame terminal to form at least one solder plated external contact terminal having a hemispherical shape under the internal contact terminal, the solder plated external contact terminal extending beyond the resin mold so that the solder plated external contact terminal is located lower than the bottom side of the semiconductor chip.

2. The bumped chip carrier package as claimed in claim 1, wherein a middle portion of the internal contact terminal is formed having a constricted shape.

* * * * *